US008901647B2

(12) United States Patent
Hirler et al.

(10) Patent No.: US 8,901,647 B2
(45) Date of Patent: Dec. 2, 2014

(54) SEMICONDUCTOR DEVICE INCLUDING FIRST AND SECOND SEMICONDUCTOR ELEMENTS (71) Applicant: Infineon Technologies AG, Neubiberg (DE)

(72) Inventors: Franz Hirler, Isen (DE); Ulrich Glaser, Putzbrunn (DE); Christian Lenzhofer, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/673,389

(22) Filed: Nov. 9, 2012

(65) Prior Publication Data
US 2013/0146971 A1 Jun. 13, 2013

Related U.S. Application Data (63) Continuation-in-part of application No. 13/314,637, filed on Dec. 8, 2011, now Pat. No. 8,530,964.

(51) Int. Cl.
H01L 29/66 (2006.01)
H01L 27/02 (2006.01)

(52) U.S. Cl.
CPC ........ H01L 27/0248 (2013.01); H01L 27/0255 (2013.01)
USPC .......................................................... 257/334

(58) Field of Classification Search
USPC ......... 257/334, 330, 594, 656, 381–385, 388, 257/413, 186, 199, 481–482, 493, 46, 257/104–106, E33.046, E27.046, E27.051, 257/E29.327–E29.331, E21.353, E21.367, 257/E21.404, 256, 287, 508, E27.148
See application file for complete search history.

(56) References Cited

U.S. PATENT DOCUMENTS

| 5,304,823 | A | 4/1994 | Byatt |
| 8,049,247 | B2* | 11/2011 | Tseng et al. ................... 257/110 |
| 8,093,623 | B2* | 1/2012 | Mawatari et al. ............. 257/173 |
| 2004/0105203 | A1* | 6/2004 | Ker et al. ......................... 361/56 |
| 2006/0097322 | A1* | 5/2006 | Kwak et al. .................... 257/355 |
| 2006/0261413 | A1* | 11/2006 | Yamada et al. ................ 257/355 |
| 2009/0026493 | A1* | 1/2009 | Hiraoka ......................... 257/173 |
| 2009/0230426 | A1* | 9/2009 | Carpenter et al. ............ 257/173 |
| 2010/0328826 | A1 | 12/2010 | Salman et al. |
| 2012/0161298 | A1* | 6/2012 | Ko et al. ....................... 257/656 |

FOREIGN PATENT DOCUMENTS

DE 4215378 C1 9/1993

* cited by examiner

Primary Examiner — Dao H Nguyen
Assistant Examiner — Tram H Nguyen
(74) Attorney, Agent, or Firm — Murphy, Bilak & Homiller, PLLC (57) ABSTRACT A semiconductor device includes a first semiconductor element including a first pn junction between a first terminal and a second terminal. The semiconductor device further includes a semiconductor element including a second pn junction between a third terminal and a fourth terminal. The semiconductor element further includes a semiconductor body including the first semiconductor element and the second semiconductor element monolithically integrated. The first and third terminals are electrically coupled to a first device terminal. The second and fourth terminals are electrically coupled to a second device terminal. A temperature coefficient $\alpha_1$ of a breakdown voltage $V_{br1}$ of the first pn junction and a temperature coefficient $\alpha_2$ of a breakdown voltage $V_{br2}$ of the second pn junction have a same algebraic sign and satisfy $0.6 \times \alpha_1 < \alpha_2 < 1.1 \times \alpha_1$ at T=300 K, wherein $V_{br2} < V_{br1}$.

25 Claims, 11 Drawing Sheets

SEMICONDUCTOR DEVICE INCLUDING FIRST AND SECOND SEMICONDUCTOR ELEMENTS

PRIORITY CLAIM

This application is a continuation-in-part of U.S. patent application Ser. No. 13/314,637, filed on 8 Dec. 2011, the content of said application incorporated herein by reference in its entirety.

BACKGROUND

When switching inductive loads at high speed or during electrostatic discharge events, semiconductor components such as power switches or electrostatic discharge devices are required to dissipate energy stored in an inductor or charged element. This requires adjustment of the turn-on behavior of these semiconductor components relative to other semiconductor elements to ensure that the semiconductor element which is designated to dissipate the energy absorbs a respective discharge current and, consequently, to avoid any overstress of semiconductor elements that are not capable of absorbing the energy and to avoid any overstress in a mode that would lead to destruction of devices.

Thus, it is desirable to improve energy dissipation in a semiconductor device when switching off inductive loads at high speed or during electrostatic discharge events.

SUMMARY

According to an embodiment of a semiconductor device, the semiconductor device includes a first semiconductor element including a first pn junction between a first terminal and a second terminal. The semiconductor device further includes a semiconductor element including a second pn junction between a third terminal and a fourth terminal. The semiconductor element further includes a semiconductor body including the first semiconductor element and the second semiconductor element monolithically integrated. The first and third terminals are electrically coupled to a first device terminal. The second and fourth terminals are electrically coupled to a second device terminal. A temperature coefficient $\alpha_1$ of a breakdown voltage $V_{br1}$ of the first pn junction and a temperature coefficient $\alpha_2$ of a breakdown voltage $V_{br2}$ of the second pn junction have a same algebraic sign and satisfy $0.6 \times \alpha_1 < \alpha_2 < 1.1 \times \alpha_1$ at T=300K, wherein $V_{br2} < V_{br1}$.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. As an example, none, part or all of the intervening element(s) may be controllable to provide a low-ohmic connection and, at another time, a non-low-ohmic connection between the "coupled" or "electrically coupled" elements. The term "electrically connected" intends to describe a low-ohmic electric connection between the elements electrically connected together, e.g., a connection via a metal and/or highly doped semiconductor.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+-doped regions can have different absolute doping concentrations. The same applies, for example, to an n+-doped and a p+-doped region.

Specific embodiments described in this specification pertain to, without being limited thereto, power semiconductor devices which are controlled by field-effect and particularly to unipolar devices such as MOSFETs.

The term "field-effect" as used in this specification intends to describe the electric field mediated formation of an "inversion channel" and/or control of conductivity and/or shape of the inversion channel in a semiconductor channel region.

In the context of the present specification, the term "field-effect structure" intends to describe a structure which is formed in a semiconductor substrate or semiconductor body or semiconductor device and has a gate electrode which is insulated at least from the body region by a dielectric region or dielectric layer or part of an insulating structure. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$) or stacks of these materials.

Above a threshold voltage $V_{th}$ between the gate electrode and the source electrode, which is typically connected to the body region, an inversion channel is formed and/or controlled due to the field-effect in a channel region of the body region adjoining the dielectric region or dielectric layer. The threshold voltage $V_{th}$ typically refers to the minimum gate voltage necessary for the onset of a unipolar current flow between the two semiconductor regions of the first conductivity type, which form the source and the drain of a transistor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Figure 1A:
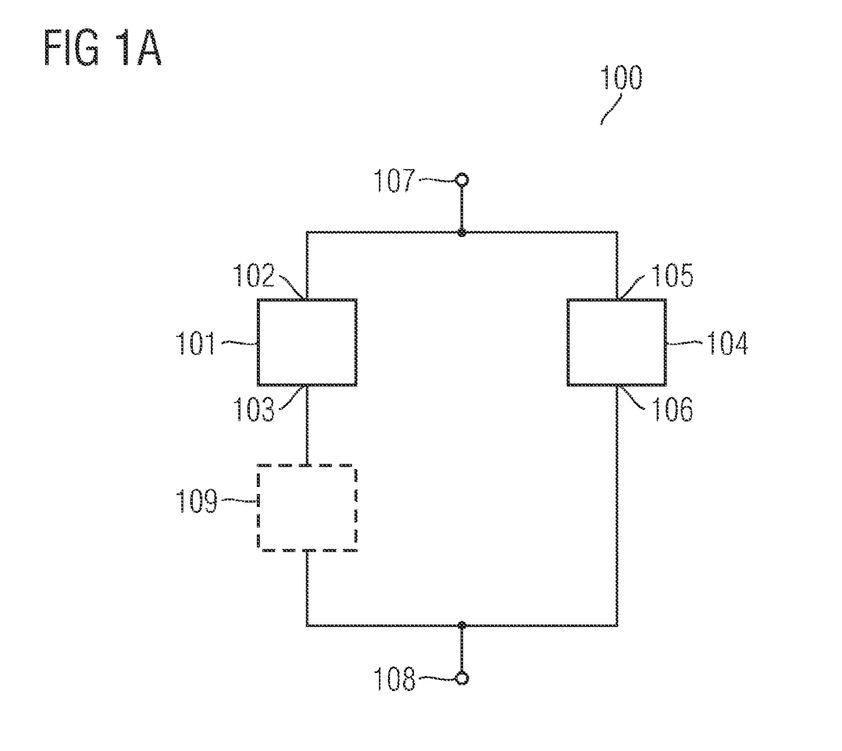
FIG. 1A is a schematic illustration of an equivalent circuit of one embodiment of semiconductor device including a first semiconductor element and a second semiconductor element.

FIG. 1A schematically illustrates one embodiment of a circuit diagram of a semiconductor device 100. The semiconductor device 100 includes a first semiconductor element 101 including a first pn junction between a first terminal 102 and a second terminal 103. The semiconductor device 100 further includes a second semiconductor device 104 including a second pn junction between a third terminal 105 and a fourth terminal 106. The first and second semiconductor elements 101, 104 are integrated monolithically in a semiconductor body (not illustrated in FIG. 1A, cf. FIG. 1B). The first and third terminals 102, 105 are electrically coupled to a first device terminal 107. The second and fourth terminals 103, 106 are electrically coupled to a second device terminal 108. A temperature coefficient $\alpha_1$ of a breakdown voltage $V_{br1}$ of the first pn junction of the first semiconductor element 101 and a temperature coefficient $\alpha_2$ of a breakdown voltage $V_{br2}$ of the second pn junction of the semiconductor element 104 have a same algebraic sign and satisfy $0.6 \times \alpha_1 < \alpha_2 < 1.1 \times \alpha_1$ at T=300K, wherein $V_{br2} < V_{br1}$. According to another embodiment, the relation $0.8 \times \alpha_1 < \alpha_2 < \alpha_1$ at T=300K is valid.

Each one of the first and third terminals 102, 105 may not be directly coupled to the first device terminal 107 but include intervening elements. Likewise, each one of the second and fourth terminals 103, 106 may not be directly coupled to the second device terminal 108 but include one or more intervening elements. As an example, an intervening element 109 between the second terminal 103 and the second device terminal 108 is schematically illustrated. However, more or less intervening elements may be arranged between one or more of the terminals 102, 103, 105, 106 and the corresponding one of the device terminals 107, 108.

In the schematic illustration of the circuit diagram of FIG. 1A, each one of the first and second semiconductor elements 101, 104 is illustrated as a two terminal device such as, e.g., a diode. However, one or both of these elements 101, 104 may include more than two terminals, e.g., three terminals such as two load terminals and one control terminal. As an example, the first and/or the second semiconductor element 101, 104 may include a FET having source, drain, gate and a bipolar transistor having collector, emitter, base, for example.

The device terminals 107, 108 may be, but are not limited to, chip pins including pins such as Ground, Battery, Input, Output and/or voltage taps, for example.

Figure 1B:
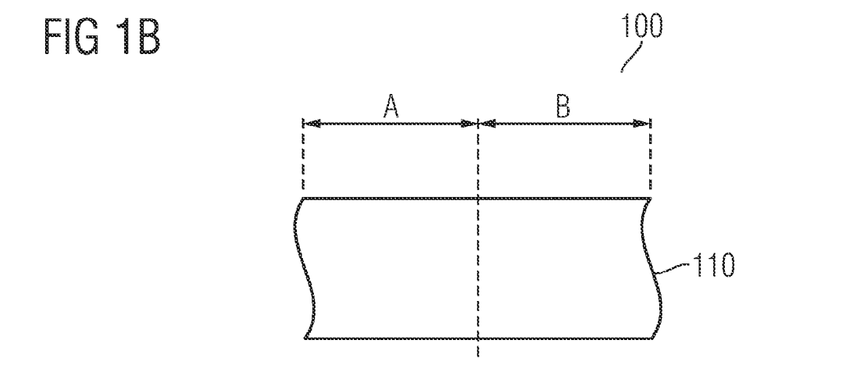
FIG. 1B is one embodiment of a schematic cross-sectional view of the semiconductor device illustrated in FIG. 1A.

FIG. 1B schematically illustrates one embodiment of a cross-sectional view of the semiconductor device 100 of FIG. 1A. In an area A of a semiconductor body 110, e.g., a semiconductor substrate such as a silicon (Si) substrate or a carrier having a semiconductor layer, e.g., an epitaxial Si layer, formed thereon, the first semiconductor element 101 or a part thereof is formed. In a second area B of the semiconductor body 110, the second semiconductor element 104 or a part thereof is formed. Thus, semiconductor elements 101, 104 are monolithically integrated. The semiconductor elements are interconnected as is illustrated in FIG. 1A (not illustrated in FIG. 1B).

In the schematic cross-sectional view of FIG. 1B, the region A including the first semiconductor element 101 laterally adjoins the second region B including the second semiconductor element 104. According to another embodiment, a lateral distance between the region A and the region B is smaller than 1000 µm, in particular smaller than 100 µm. The region A and the region B may also be arranged directly next to each other. This allows for a favorable thermal coupling between the first and second semiconductor elements 101, 104. This further allows to minimize the impact of process variations which typically increase with increasing distance. Thus, adjustment of these elements is improved. According to another embodiment, region B is surrounded by region A, e.g. region B may include a sense cell that is spread, e.g., spread evenly, over the area A of a transistor cell array, for example.

By setting the temperature coefficients $\alpha_1$, $\alpha_2$ and breakdown voltages $V_{br1}$, $V_{br2}$ as described above, which is achieved by using similar structures and doping profiles, matching of the semiconductor elements 101, 104 can be improved. Hence, reliability of energy dissipation in a designated one of the first and second semiconductor elements 101, 104 during an electrostatic discharge event or during switching off an inductive load can be improved.

Figure 2:
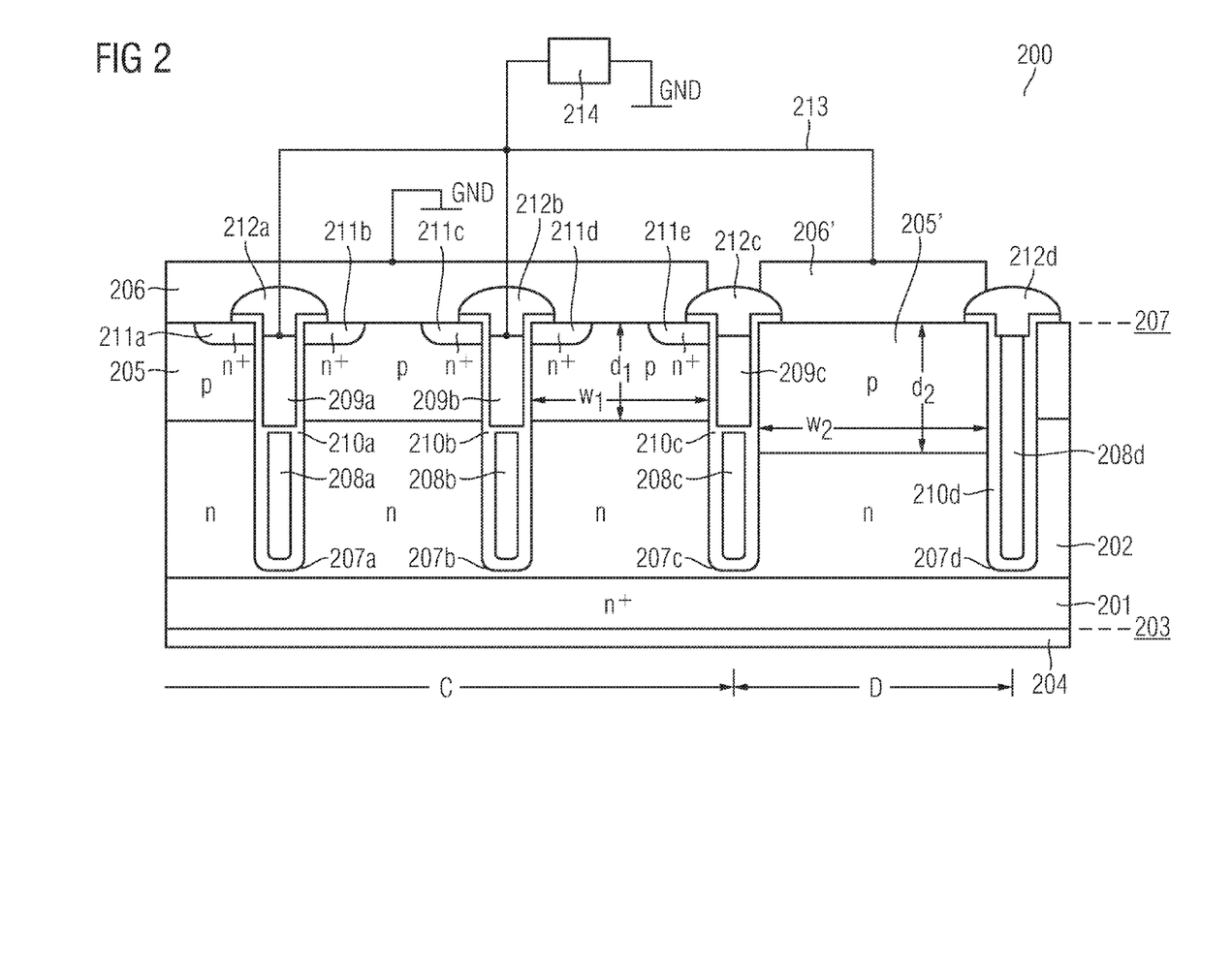
FIG. 2 illustrates a schematic cross-sectional view of one embodiment of a semiconductor device including a cell array of a trench n-type field effect transistor (NFET) and a trench sense cell.

FIG. 2 schematically illustrates one embodiment of a cross-sectional view of a semiconductor device 200 including a trench NFET cell array in an area C and a trench sense cell in an area D.

The trench NFET and the trench cell sense cell share an $n^+$-doped semiconductor substrate 201 and an n-doped drift zone 202, e.g. an n-doped epitaxial layer, formed thereon. At a rear side 203 of the $n^+$-doped semiconductor substrate 201 a contact 204, e.g., a metal contact including, e.g., Al, Ti, Ag, Au, Ni, Cu, Tu is formed. The contact 204 constitutes a drain contact of both the trench NFET and the sense cell.

The drift zone 202 in the area C of the trench NFET adjoins a p-doped body region 205. The p-doped body region 205 is electrically coupled to a conductive layer 206 at a front side 207. A $p^+$-doped body contact zone may be provided at an interface between the p-doped body region 205 and the conductive layer 206 (not illustrated in FIG. 2). This body contact zone may establish an ohmic contact between the p-doped body region 205 and the conductive layer 206.

Trenches 207a . . . c extend from the front side 207 through the p-doped body region 205 into the n-doped drift zone 202 of the trench NFET. As an example, the trenches 207a . . . c or some of the trenches 207a . . . c may constitute part of a continuous trench structure. Field electrodes 208a . . . c are arranged in a bottom part of the trenches 207a . . . c and gate electrodes 209a . . . c are arranged in a top part of the trenches 207a . . . c. Insulating structures 210a . . . c are arranged between the field electrodes 208a . . . c and the gate electrodes 209a . . . c. The insulating structures 210a . . . c include gate dielectrics adjoining the body region 205 and also provide an electric insulation between the electrodes 208a . . . c, 209a . . . c and the surrounding drift zone 202/body region 205. In other embodiments, field electrodes can be omitted or can be part of the gate electrodes.

Further, $n^+$-doped source regions 211a . . . e laterally adjoin the trenches 207a . . . c and are electrically coupled to the conductive layer 206. Insulating caps 212a . . . c are arranged on the gate electrodes 209a . . . c and provide an electric insulation between the conductive layer 206 and the gate electrodes 209a . . . c.

The drift zone 202 in an area D of the trench sense cell adjoins a p-doped body region 205'. In the embodiment illustrated in FIG. 2, the p-doped body region 205' has a width $w_2$ that is larger than a width $w_1$ of the p-doped body region 205 in the area C of the trench NFET. Further, the p-doped body region 205' has a depth $d_2$, i.e. a vertical dimension, that is larger than a depth $d_1$ of the p-doped body region 205 in the area C of the trench NFET. These layout and design measures allow the setting of a breakdown voltage $V_{br1}$ of a first pn junction including the p-doped body region 205 and the n-doped drift zone 202 in the area C larger than a breakdown voltage $V_{br2}$ of a second pn junction including the p-doped body region 205' and the n-doped drift zone 202 in the area D of the trench sense cell.

The p-doped body region 205' laterally adjoins the insulating structure 210c on one side and an insulating structure 210d on another side opposite to the one side. The insulating structure 210d electrically insulates a field electrode 208d in a trench 207d. The p-doped body region 205' is electrically coupled to a conductive layer 206'. Similar to the trench NFET in the region C, a $p^+$-doped body contact zone may be provided to establish an ohmic contact between the conductive layer 206' and the p-doped body region 205' (not illustrated in FIG. 2). An insulating cap 212d is arranged on top of the field electrode 208c. In the embodiment illustrated in FIG. 2, the trench sense cell lacks any $n^+$-doped source regions. The field electrodes 208a . . . d are typically electrically coupled to the conductive layer 206. In other embodiments the field electrode 208d may be electrically coupled to the conductive layer 206'.

The p-doped body region 205' is electrically coupled to the gate electrodes 209a . . . b of the trench NFET in the area C via the conductive layer 206' and optional intervening elements, e.g., a wiring. The optional intervening elements are illustrated in a simplified manner by a line 213. The p-doped body region 205' is further electrically coupled to a device terminal GND via an intervening element 214. The intervening element 214 may include a resistor, and/or a part of a gate driver circuit, and/or a part of a transformer, for example. As an example, when turning off IGBTs with a negative supply voltage, the electrical coupling may be effected via part of a transformer. The conductive layer 206 is also electrically connected with the device terminal GND. Thus, the interconnection between the trench NFET in the area C and the trench sense cell in the area D is one example of an interconnection as illustrated in the schematic circuit diagram of FIG. 1A. In other words, the trench NFET in the area C is one example of the second semiconductor element 104 illustrated in FIG. 1A and the trench sense cell in the area D is one example of the first semiconductor element 101 illustrated in FIG. 1A.

The design of the first and second pn junctions of the semiconductor device 200 allows the adjustments of a temperature coefficient $\alpha_1$ of the breakdown voltage $V_{br1}$ of the first pn junction and a temperature coefficient $\alpha_2$ of the breakdown voltage $V_{br2}$ of the second pn junction to have a same algebraic sign and to satisfy $0.6 \times \alpha_1 < \alpha_2 < 1.1 \times \alpha_1$ at T=300K.

Thus, when switching off an inductive load via the semiconductor device 200, an increase of a reverse voltage of the pn junctions first triggers an electrical breakdown of the second pn junction of the trench sense cell in the area D while the first pn junction of the trench NFET in the area C remains in a blocking state. A breakdown current, e.g., an avalanche current, generated in the trench sense cell flows to GND via the intervening element 214. A voltage drop across the intervening element 214, e.g., across an internal gate resistor and/or an external gate resistor and/or a internal resistance of a gate driver circuit, leads to a current flowing along the channel between source and drain of the trench NFET in the area C as soon as this voltage drop exceeds the threshold voltage of the trench NFET 200. Thus, when switching off an inductive load via the semiconductor device 200, dissipation of energy stored in the inductor occurs within the trench NFET in the area C triggered by electrical breakdown in the trench sense cell in the area D. Since the current within the trench NFET in the area C between the conductive layer 206 and the drift zone 202 is a channel current, avalanche generation within the trench NFET 200 can be reduced by several orders of magnitude. Hence, trapping of hot carriers within the insulating structures 210a . . . b which would occur during avalanche breakdown of the trench NFET can be significantly reduced. This leads to an improved reliability of the semiconductor device 200.

According to one embodiment, a difference between the first breakdown voltage $V_{br1}$ of the first pn junction and the second breakdown voltage $V_{br2}$ of the second pn junction is in a range between 50% to 600%, even 50% to 300%, of a threshold voltage of the trench NFET in the area C. A difference Vbr1−Vbr2 may be within a range of 2V to 10V, for example.

The semiconductor device 200 illustrated in FIG. 2 is one example of a device design having a breakdown voltage $V_{br2}$ in a trench sense cell that is smaller than the breakdown voltage $V_{br1}$ in the trench NFET 200 such that a temperature coefficient of breakdown voltages $\alpha_1$ of the first pn junction and a temperature coefficient of breakdown voltage $\alpha_2$ of the second pn junction have a same algebraic sign and satisfy $0.6 \times \alpha_1 < \alpha_2 < 1.1 \times \alpha_1$ at T=300K.

Figure 3:
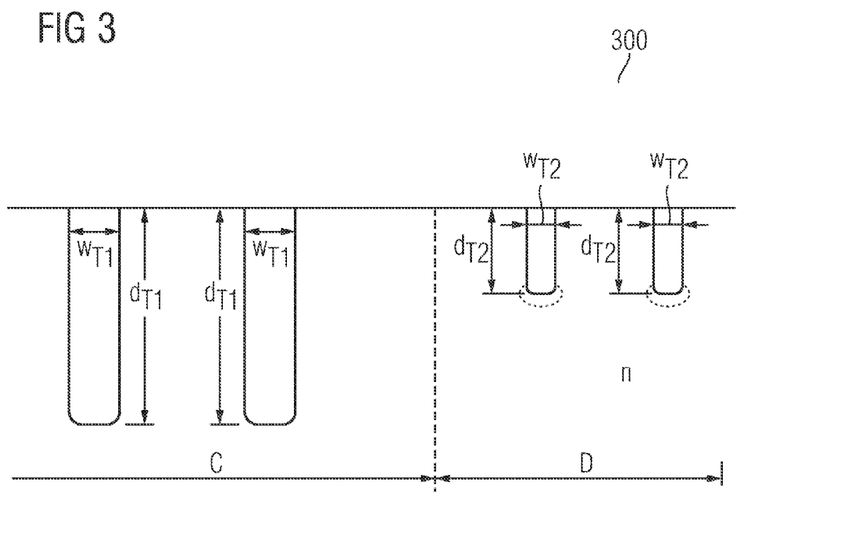
FIG. 3 is a schematic illustration of one embodiment of a cross-sectional view of a semiconductor device including a cell array of a trench NFET and a trench sense cell, the trenches of the trench NFET and the trench sense cell having a different depth.

However, apart from the design of the semiconductor device 200 illustrated in FIG. 2, other design measures may also allow the setting of the breakdown voltage $V_{br2}$ of the trench sense cell of the area D smaller than the breakdown voltage $V_{br1}$ of the trench NFET in the area C. A further example of such a design is illustrated in simplified manner in the schematic cross-sectional view of a FIG. 3. In FIG. 3, a reduction of the breakdown voltage of the trench sense cell in the area D compared with the breakdown voltage of the trench NFET in the area C is effected by setting a depth $d_{T2}$ of the trenches of the trench sense cell smaller than a depth $d_{T1}$ of the trenches of the trench NFET. In the case of trench FETs including field electrodes effecting charge compensation in the drift zone, this may be achieved by setting a width $w_{T2}$ of the trenches of the trench sense cell D smaller than a width $w_{T1}$ of trenches of the trench NFET, for example.

According to another embodiment, the trenches of the trench sense cell D may be completely filled with an insulating material, e.g., $SiO_2$.

According to yet another embodiment, an optional shielding region of the first conductivity type is arranged within the drift zone and adjoins a bottom side of the trenches of the trench sense cell. The shielding region is schematically illustrated in FIG. 3 by a dashed line and may include a dose of p-type impurities in a range of $1 \times 10^{12}$ cm$^{-2}$ to $1 \times 10^{13}$ cm$^{-2}$, for example.

Figure 4:
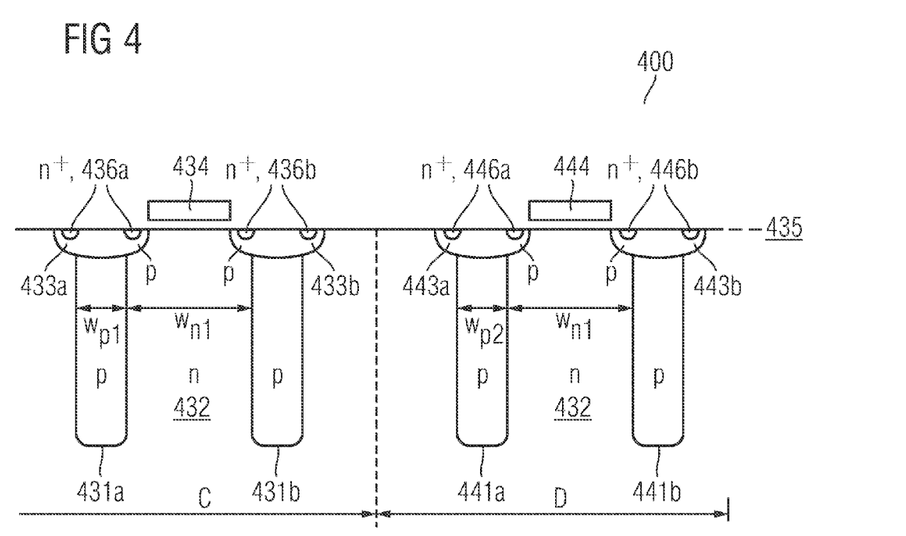
FIG. 4 is a schematic illustration of one embodiment of a cross-sectional view of a superjunction device including a cell array of a superjunction field effect transistor and a superjunction sense cell.

Yet another example of a design of a semiconductor device 400 is illustrated in simplified manner in the schematic cross-sectional view of FIG. 4. In FIG. 4, the semiconductor device 400 includes a cell array of a superjunction FET in a first area C and a superjunction sense cell in a second area D. The superjunction FET includes first p-doped compensation regions 431a, 431b formed within an n-doped drift zone 432. First p-doped body regions 433a, 433b adjoin a first side 435 and the first p-doped compensation regions 431a, 431b. First n$^+$-type source regions 436a, 436b are arranged within the first p-doped body regions 433a, 433b and adjoin the first side 435. A first gate structure 434 is arranged on the first side 435.

The superjunction sense cell in the area D includes second p-doped compensation regions 441a, 441b formed within the n-doped drift zone 432. Second p-doped body regions 443a, 443b adjoin the first side 435 and the second p-doped compensation regions 441a, 441b. Second n$^+$-type source regions 446a, 446b are arranged within the second p-doped body regions 443a, 443b and adjoin the first side 435. A gate structure 444 may be arranged on the first side 435.

A reduction of a breakdown voltage $V_{br1}$ of the superjunction sense cell in the second area D compared with a breakdown voltage $V_{br2}$ of the superjunction FET in the first area C may be achieved by adjusting lateral dimensions $w_{p1}$, $w_{n1}$, $w_{p2}$, $w_{n2}$ of the compensation regions and drift zones in the superjunction NFET and superjunction sense cell, for example. As an example, in a p-loaded superjunction FET $w_{p1} < w_{p2}$ or $w_{n1} > w_{n2}$ may be set. As a further example, in an n-loaded superjunction FET $w_{p1} > w_{p2}$ or w may be set. As a further example for reducing a breakdown voltage $V_{br1}$ of the superjunction sense cell in the second area D compared with a breakdown voltage $V_{br2}$ of the superjunction FET in the first area C, a depth of the second p-doped compensation regions 441a, 441b may be set smaller than the depth of the p-doped compensation regions 431a, 431b.

Although the specific embodiments described above included NFETs, the above-described teaching may also be applied to other semiconductor devices including planar DMOSFETs (Double-diffused MOSFETs) including non-compensated drift zones, lateral DMOSFETs and IGBTs. The FETs may also be formed as drain-up FETs.

Figure 5:
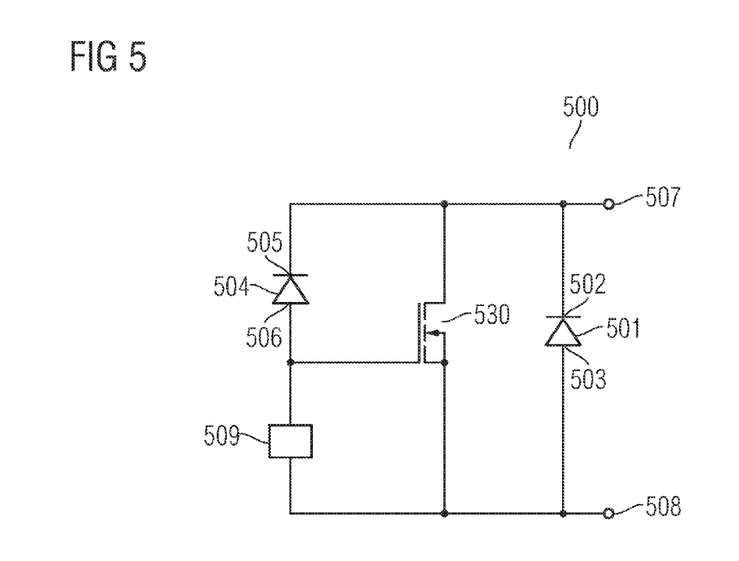
FIG. 5 is a schematic illustration of one embodiment of a circuit diagram of a semiconductor device including a first diode triggering an NFET and a second diode configured to withstand electrostatic discharge currents.

FIG. 5 schematically illustrates one embodiment of a circuit diagram of a semiconductor device 500. The semiconductor device 500 includes a first semiconductor diode 501 including a first pn junction between a first cathode 502 and a first anode 503. The semiconductor device 500 further includes a second semiconductor diode 504 including a second pn junction between a second cathode 505 and a second anode 506.

Figure 6:
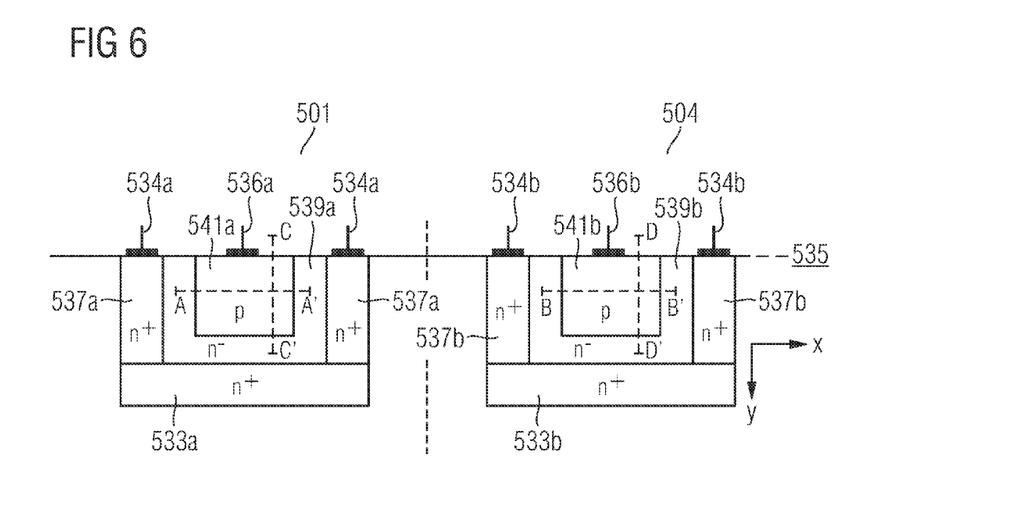
FIG. 6 is one embodiment of a schematic cross-sectional view of a part of the semiconductor device illustrated in FIG. 5.

The first and second semiconductor diodes 501, 504 are integrated monolithically in a semiconductor body (not illustrated in FIG. 5, cf. FIG. 6). The first and second cathodes 502, 505 are electrically coupled to a first device terminal 507. The first and second anodes 503, 506 are electrically coupled to a second device terminal 508. The second anode 506 is electrically coupled to the second device terminal 508 via an intervening element 509. A temperature coefficient $\alpha_1$ of a breakdown voltage $V_{br1}$ of the first pn junction of the first semiconductor diode 501 and a temperature coefficient $\alpha_2$ of a breakdown voltage $V_{br2}$ of the second pn junction of the second semiconductor diode 504 have a same algebraic sign and satisfy $0.6 \times \alpha_1 < \alpha_2 < 1.1 \times \alpha_1$ at T=300K, wherein $V_{br2} < V_{br1}$.

The semiconductor device 500 further includes an NFET 530. A drain of the NFET 530 is electrically coupled to the first device terminal 507. A source of the NFET is electrically coupled to the second device terminal 508. A gate of the NFET is electrically coupled to the anode 506 of the second diode 504.

When switching off an inductive load via NFET 530, an increase of a voltage between the first and second device terminals 507, 508 leads to a breakdown of the second semiconductor diode 504. The second semiconductor diode 504 may clamp the voltage between the first and second device terminals 507, 508 by acting as a voltage divider together with the intervening element in such a way that the NFET 530 is turned on to dissipate energy stored in the inductor that is switched off.

During electrostatic discharge between the first and second device terminal, the first semiconductor diode 501 absorbs most of the discharge current due to constraints in area and inner resistance of NFET 530. Thus, a voltage between device terminals 507 and 508 rises until the first semiconductor diode 501 absorbs the discharge current. Since the first and second semiconductor diodes 501, 504 are closely correlated with regard to their temperature coefficients $\alpha_1$, $\alpha_2$ and their breakdown voltages $V_{br1}$ and $V_{br2}$, a so-called ESD window, i.e. voltage range of operation of ESD protection element, can be increased while providing a safe operation of the device over an overall operation temperature range and/or an area consumption can be reduced.

FIG. 6 illustrates one embodiment of a cross-sectional view of the first and second semiconductor diodes 501, 504 of the semiconductor device 500 illustrated in FIG. 5. With regard to an interconnection between the first and second semiconductor diodes 501, 504, reference is made to the circuit diagram illustrated in FIG. 5.

The first semiconductor diode 501 includes an $n^+$-doped buried layer 533a that is electrically coupled to a first cathode contact 534a at a front side 535 via an $n^+$-doped sinker 537a. The $n^+$-doped sinker 537a and the $n^+$-doped buried layer 533a encompass an $n^-$-doped layer 539a that may be a part of an epitaxial layer. The $n^-$-doped layer 539a encompasses a p-doped anode region 541a. The p-doped anode region 541a adjoins the front side 535 and is electrically coupled to an anode contact 536a. According to one embodiment, the p-doped anode region 541a includes a profile of p-type impurities having a sufficient concentration at the front side 535 that allows the forming of an ohmic contact to the anode contact 536a. Alternatively or in addition, a $p^+$-doped anode contact zone may be provided within the p-doped anode region 541a at the front side 535.

Similar to the first diode 501, also the second diode includes an $n^+$-doped buried layer 533b, an $n^+$-doped sinker 537b, an $n^-$-doped layer 539b, a p-doped anode region 541b, a second cathode contact 534b and a second anode contact 536b. The corresponding elements in the first and second diode are manufactured using the same process steps.

A breakdown voltage $V_{br1}$ of the first diode 501 is set larger than a breakdown voltage $V_{br2}$ of the second diode 504 by choosing different doses of p-type impurities in the p-doped anode regions 541a, 541b. According to one embodiment, an average sheet concentration of p-type impurities in the p-doped anode regions 541a, 541b may be set differently by using different mask apertures or arrays of different mask apertures when implanting these impurities in the respective regions. As an example, outdiffusion of impurities implanted through neighboring mask openings leads to an overlap impurity profiles. Enhanced outdiffusion will homogenize the profile along a lateral direction.

Although the first and second diodes 501, 504 illustrated in the example of FIG. 6 include the $n^+$-doped buried layers 533a, 533b and the $n^+$-doped sinkers 537a, 537b, the $n^+$-doped sinkers 537a, 537b may also be omitted, e.g., in a lateral pn junction diode. Further, the $n^+$-doped sinkers 537a, 537b may also be replaced by trenches that are at least partially filled with $n^+$-doped semiconductor material, e.g. $n^+$-doped polysilicon adjoining sidewalls of the trenches.

Since the first and second semiconductor diodes 501, 504 are closely correlated with regard to their breakdown voltages $V_{br1}$, $V_{br2}$ and temperature coefficients $\alpha_1$, $\alpha_2$ due to similar or same processing of the anode and cathode semiconductor regions, the so-called ESD window may be increased while providing a safe operation of the device over an overall operation temperature range.

Figure 7:
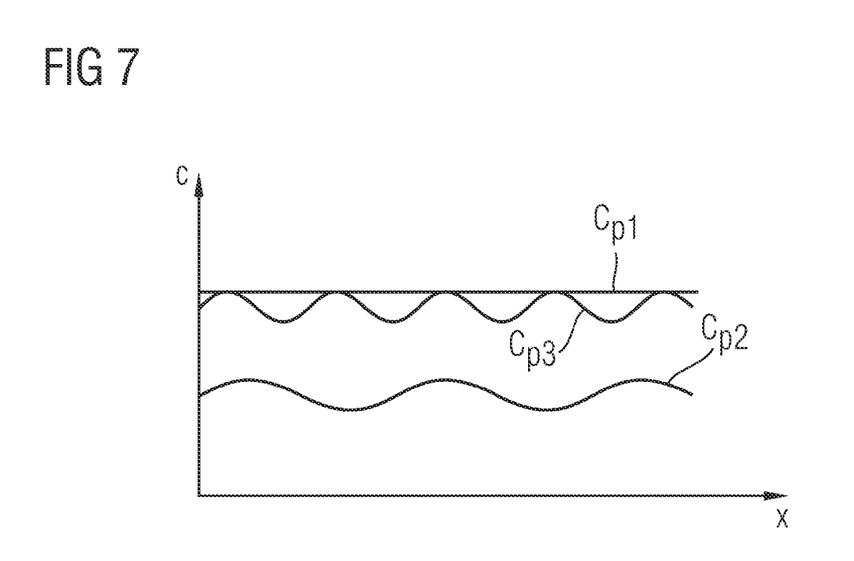
FIG. 7 is a schematic diagram illustrating embodiments of a lateral p-type impurity profile along lines AA' and BB' of the device illustrated in FIG. 6.

Examples of p-type impurity profiles are illustrated in FIG. 7.

Referring to the schematic diagram illustrated in FIG. 7, according to a first example, a profile of concentration $c_{p1}$ along a lateral direction x of line BB' in the anode region 541b of the second diode 504 illustrated in FIG. 6 is constant, and a profile of concentration $c_{p2}$ along the lateral direction x of line AA' in the anode region 541a of the first diode 501 is corrugated and includes minima and maxima. The corrugated profile $c_{p2}$ may be formed by implanting the p-type impurities via a mask having apertures above the anode regions 541b to be formed. The apertures may be arranged as a regular pattern of openings such as squares leading to a corresponding regular pattern of maxima in the profile $c_{p2}$. The pattern of maxima is in an area parallel to the front side 535.

According to another example, a profile $c_o$ along the lateral direction x of line BB' in the anode region 541b of the second diode 504 is corrugated and includes minima and maxima. In this example, $c_{p3} > c_{p2}$ holds to set $V_{br1} > V_{br2}$.

According to yet another example, $V_{br1} > V_{br2}$ may also be set by implanting a first p-type impurity dose into both the first and second anode regions and a second p-type impurity dose into only the second anode region or a smaller n-type impurity dose only into the first anode region.

Examples of setting $V_{br1} > V_{br2}$ in the device illustrated in FIG. 5 were explained above. Further examples include setting different doses of p- or n-type impurities not only in the anode region but in the anode region and cathode region or merely in the cathode region.

As an example, these doses may be set accordingly such that the relation $0 < (V_{br1} - V_{br2})/V_{br1} < 0.2$ holds.

Figure 8:
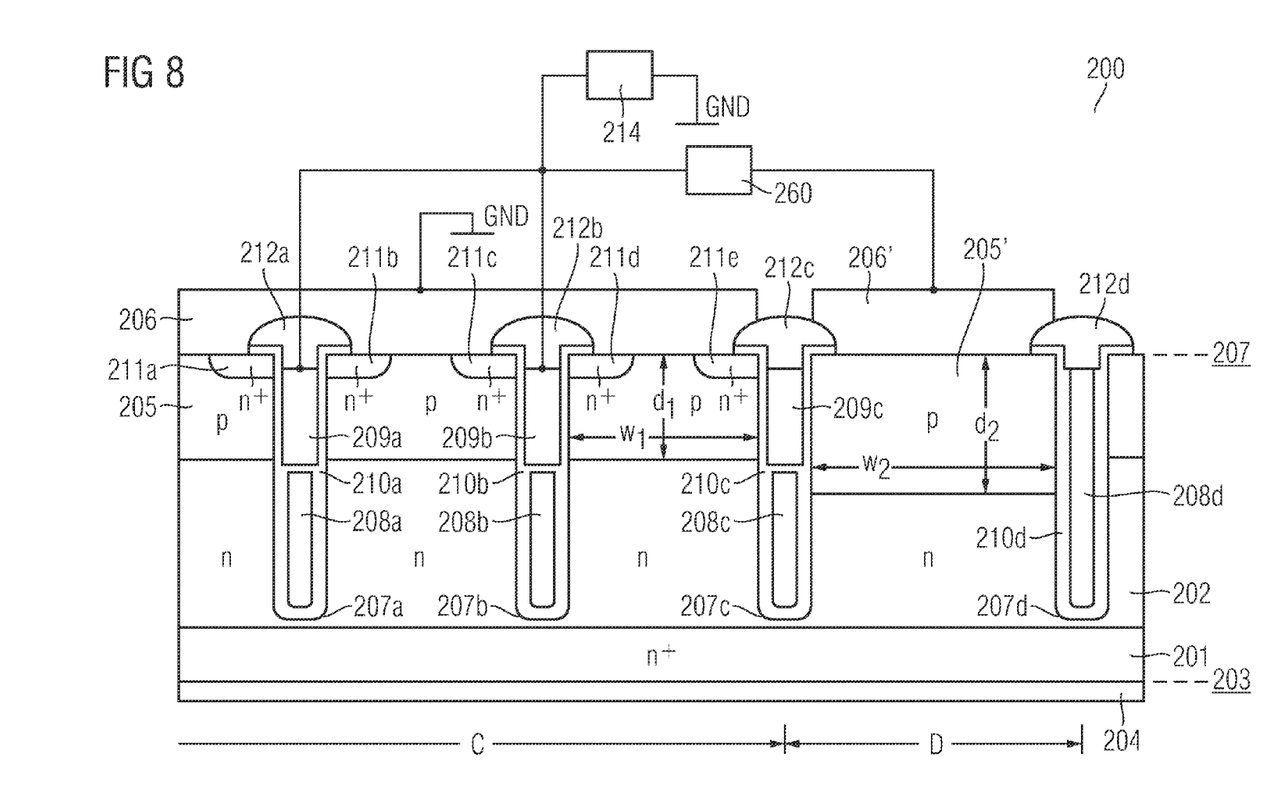
FIG. 8 illustrates a schematic cross-sectional view of the semiconductor device illustrated in FIG. 2 including at least one intervening element electrically coupled between the trench sense cell and gate electrodes of the trench NFET.

FIG. 8 illustrates a schematic cross-sectional view of the semiconductor device illustrated in FIG. 2 including a first type of intervening element 260 electrically coupled between the p-doped body region 205' and the gate electrodes 209a . . . b of the trench NFET in the area C via the conductive layer 206'. The first type of intervening element 260 is one example of an intervening element illustrated in simplified manner in FIG. 2 by the line 213. The intervening element 214 may be a second type of intervening element. Examples of the first and second types of intervening elements 260, 214 are described and illustrated as follows.

Figure 9:
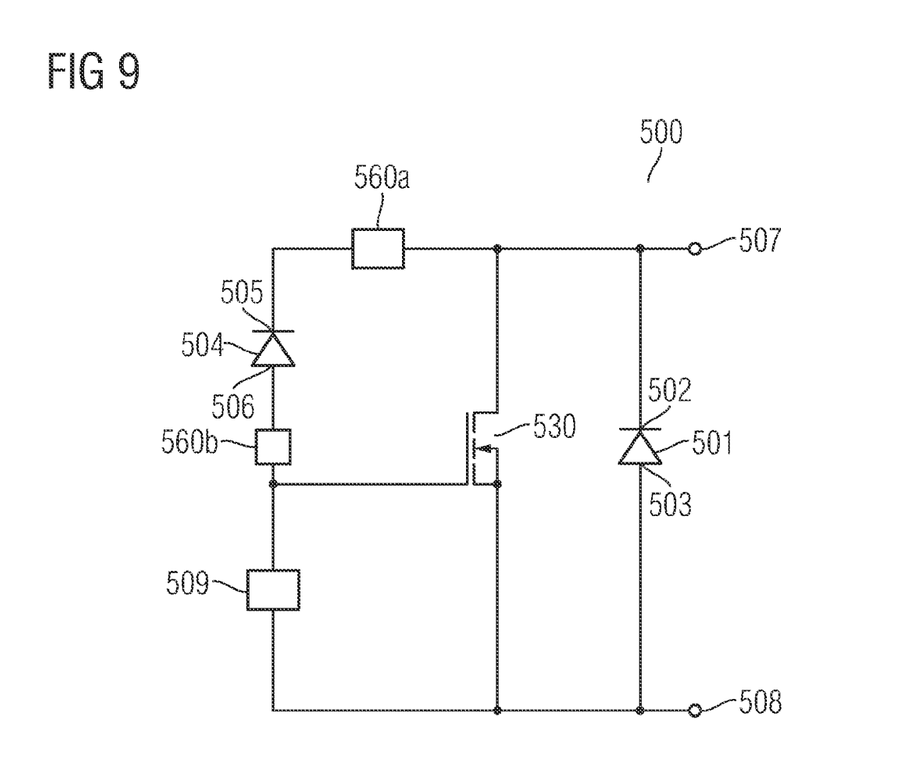
FIG. 9 illustrates a schematic of the circuit diagram of the semiconductor device illustrated in FIG. 5 including intervening elements electrically coupled between a drain and a gate of the NFET.

FIG. 9 illustrates a schematic of the circuit diagram of the semiconductor device illustrated in FIG. 5 including a first type of intervening elements 560a, 560b electrically coupled between a drain, and a gate of the NFET 530. The intervening element 509 may be a second type of intervening element. Examples of the first and second types of intervening elements 560a, 560b, 509 are described and illustrated as follows. In the embodiment illustrated in FIG. 9, one of the intervening elements 560a, 560b or both of the intervening elements 560a, 560b may be included.

Figure 10A:
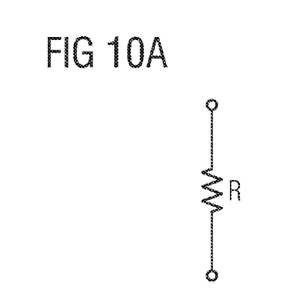
FIGS. 10A to 10C illustrate examples of current limiting intervening elements.
Figure 10B:
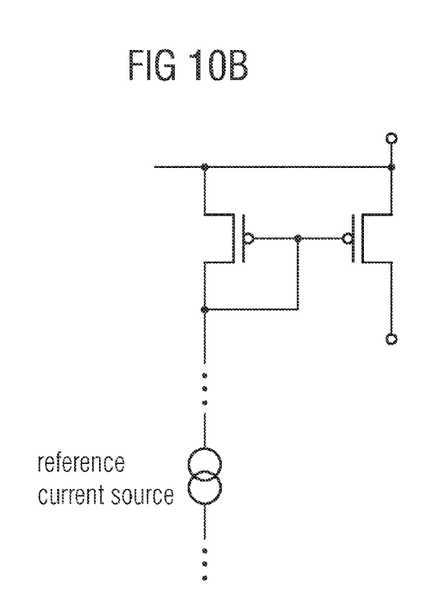
Figure 10C:
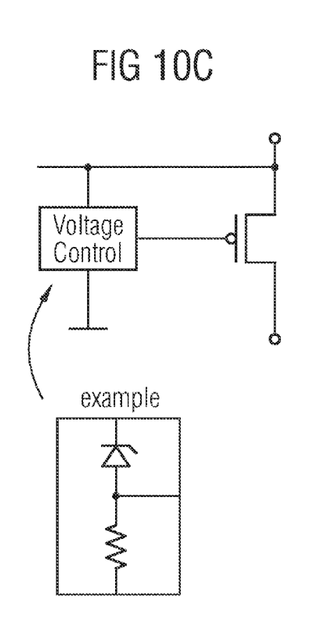

One example of the first type of intervening elements includes current limiting intervening elements that limit current for example as a function of the applied voltage. One example of a current limiting intervening element is a resistor (R) as illustrated in FIG. 10A that may have a linear current-voltage characteristic. Another example of a current limiting intervening element is a current mirror as illustrated in FIG. 10B that may have a non-linear current-voltage characteristic. Yet another example of a current limiting intervening element is a transistor including an optional voltage control circuit as illustrated in FIG. 10C.

Another example of the first type of intervening elements includes rectifying elements allowing current flow of only one polarity. With regard to the other polarity, the rectifying element includes a high resistance. For example, when operating the trench NFET cell array in the area C illustrated in FIGS. 2 and 8 in a normal mode, e.g. on-state, a voltage at the gate is typically greater than a voltage at the drain. The intervening elements 213, 260 in FIG. 2, 8 prevent discharge of the gate to the trench sense cell in the area D. When a voltage at the drain leads to switch-on of the trench sense cell in the area D, the intervening elements 213, 260 are in a low-resistance state and do not or do only slightly hinder current flow.

Likewise, when operating the NFET 530 illustrated in FIG. 9 in a normal mode, e.g. on-state, a voltage at the gate is typically greater than a voltage at the drain. The intervening elements 560a, 560b in FIG. 9 prevent discharge of the gate through the second semiconductor diode 504. When a voltage at the drain leads to an electrical breakdown of the second semiconductor diode 504, the intervening elements 560a, 560b are in a low-resistance state and do not or do only slightly hinder current flow through the second semiconductor diode 504.

Figure 11A:
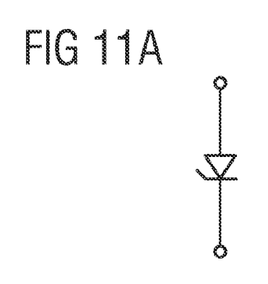
FIGS. 11A to 11F illustrate examples of rectifying intervening elements.
Figure 11B:
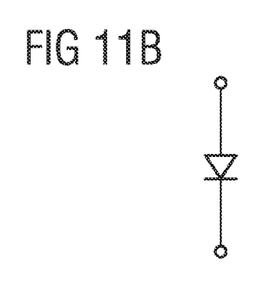
Figure 11C:
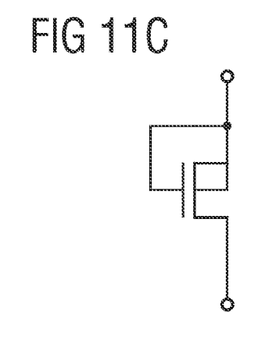
Figure 11D:
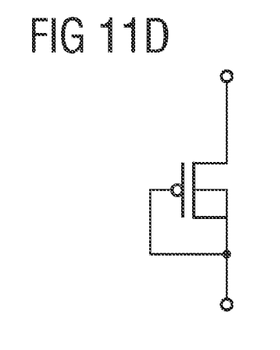
Figure 11E:
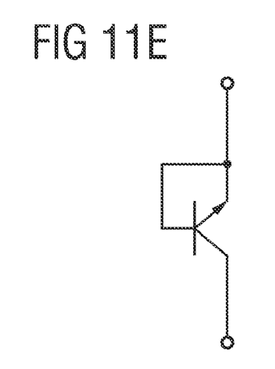
Figure 11F:
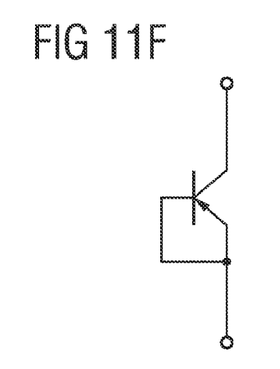

One example of a rectifying intervening element is a Zener diode illustrated in FIG. 11A. Another example of a rectifying intervening element is a diode, e.g. pn junction or Schottky diode as illustrated in FIG. 11B. Another example of a rectifying intervening element is an NFET with a gate to source/body coupling as illustrated in FIG. 11C. Another example of a rectifying intervening element is a PFET with a gate to source/body coupling as illustrated in FIG. 11D. Another example of a rectifying intervening element is an NPN transistor with a base to emitter coupling as illustrated in FIG. 11E. Another example of a rectifying intervening element is a PNP transistor with a base to emitter coupling as illustrated in FIG. 11F.

Another example of the first type of intervening elements includes switching elements allowing for switch-on and switch off functionality of the trench sense cell in the area D illustrated in FIGS. 2 and 8 and the second semiconductor diode 504 illustrated in FIG. 9. The switching elements may be switched from a low-resistance state into a high-resistance state and vice versa.

Figure 12A:
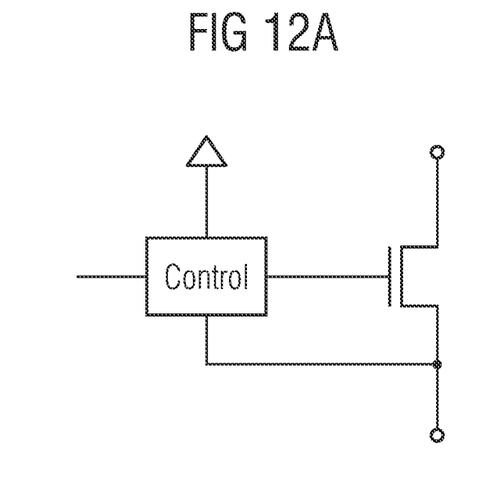
FIGS. 12A and 12B illustrate examples of switching intervening elements.
Figure 12B:
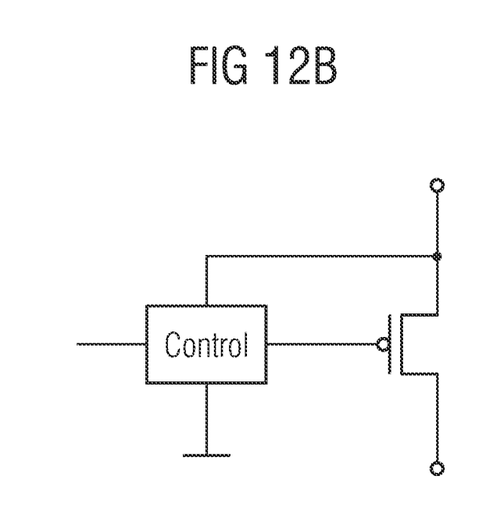

One example of a switching intervening element is an NFET, e.g. a MOSFET and a driver circuit as illustrated in FIG. 12A. Another example of a switching intervening element is a PFET, e.g. a MOSFET and a driver circuit as illustrated in FIG. 12B. The driver circuit may be configured to drive the NFET or PFET setting up two or more resistance values between its source and drain.

One example of the second type of intervening elements includes gate dielectric protection intervening elements that limit a voltage between gate and source of a FET for protection of a gate dielectric. One example of a gate dielectric protection intervening element is an element exhibiting a high-resistance state below a threshold voltage and a low-resistance state above a threshold voltage, e.g. a Zener diode, a pn junction diode or a Schottky diode as illustrated in FIGS. 11A, 11B. When using a diode like a Zener diode or avalanche diode as the gate dielectric protection intervening element, e.g. intervening element 214 (c.f. FIGS. 2 and 8) and/or intervening element 509 (c.f. FIGS. 5 and 9) a cathode of the diode is directed towards a gate to be protected, e.g. towards the gate of the trench NFET in the area C illustrated in FIGS. 2 and 8 or the gate of the NFET 530 illustrated in FIGS. 5 and 9.

Another example of the second type of intervening elements includes discharge circuits defining a discharge time constant of the gate when gate control is missing or turned off. One example of a discharge circuit is the resistor illustrated in FIG. 10A.

Another example of the second type of intervening elements includes gate clamping elements short-circuiting the gate and source of the NFET 530 illustrated in FIGS. 5 and 9 and short-circuiting the gate and source of the trench NFET in the area C of FIGS. 2 and 8. These elements allow for transistor deactivation, e.g. in a power-down mode. Examples of gate clamping elements are illustrated in FIGS. 12A and 12B, respectively.

Another example of the second type of intervening elements includes resistors with high or ultra-high resistance or disconnections, e.g. when a pre-driver of the transistor is included and no additional functionalities are required.

The intervening elements may be combined and arranged depending on parasitic structures and/or functional constraints.

Figure 13:
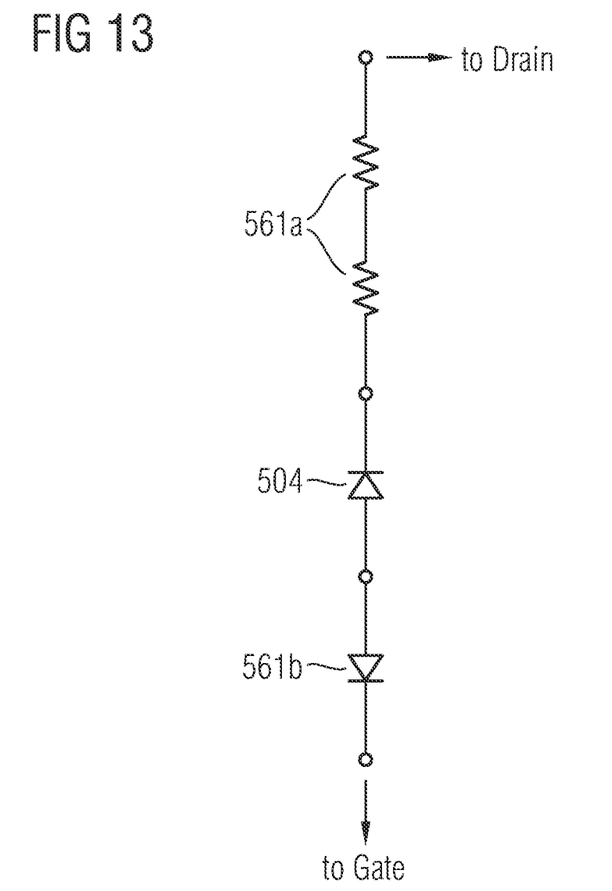
FIG. 13 illustrates one embodiment of circuit elements electrically coupled between gate and drain of the NFET illustrated in FIG. 5.

FIG. 13 illustrates one embodiment of circuit elements electrically coupled between the gate and drain of the NFET illustrated in FIGS. 5 and 9. Whereas intervening element 561a is a current limiting intervening element, intervening element 561b is a rectifying intervening element. Thus, rectifying and current limiting functions are combined by intervening elements 561a, 561b.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first semiconductor element including a first pn junction between a first terminal and a second terminal;
   a second semiconductor element including a second pn junction between a third terminal and a fourth terminal;
   a semiconductor body including the first semiconductor element and the second semiconductor element monolithically integrated; and wherein
   the first and third terminals are electrically coupled to a first device terminal;
   the second and fourth terminals are electrically coupled to a second device terminal; and
   a temperature coefficient $\alpha_1$ of a breakdown voltage $V_{br1}$ of the first pn junction and a temperature coefficient $\alpha_2$ of a breakdown voltage $V_{br2}$ of the second pn junction have a same algebraic sign and satisfy $0.6 \times \alpha_1 < \alpha_2 < 1.1 \times \alpha_1$ at T=300K, wherein $V_{br2} < V_{br1}$, wherein
   the first semiconductor element is a trench field effect transistor cell and the first pn junction includes a first body region of a first conductivity type and a first drift region of a second conductivity different from the first conductivity type;
   the first body region adjoins a first trench structure at a first side of the first body region and the first body region adjoins a second trench at a second side of the first body region opposite to the first side;

the second semiconductor element is a sense cell and the second pn junction includes a second body region of the first conductivity type and a second drift region of the second conductivity type; and the second body region adjoins a third trench structure at a first side of the second body region and the second body region adjoins a fourth trench structure at a second side of the second body region opposite to the first side; and further comprising at least one intervening element electrically coupled between a gate of the trench field effect transistor cell and the sense cell, and wherein the intervening element is one or a combination of a current limiting element, a rectifying element and a switching element.

2. The semiconductor device of claim 1, wherein the second body region is electrically coupled to a gate electrode of at least one of the first and second trench structures.

3. The semiconductor device of claim 1, wherein a difference between the first breakdown voltage $V_{br1}$ of the first pn junction and the second breakdown voltage $V_{br2}$ of the second pn junction is in a range between 50% to 600% of a threshold voltage of the trench field effect transistor.

4. The semiconductor device of claim 1, wherein each one of the first and second trench structures includes a trench filled with an insulating material.

5. The semiconductor device of claim 1, wherein a width of the first body region is larger than the width of the second body region.

6. The semiconductor device of claim 1, wherein a width of the first body region is smaller than the width of the second body region.

7. The semiconductor device of claim 1, wherein a depth of each one of the first and second trench structures is smaller than a depth of each one of the third and fourth trench structures.

8. The semiconductor device of claim 1, wherein a width of each one of the first and second trench structures is smaller than a width of each one of the third and fourth trench structures.

9. The semiconductor device of claim 1, wherein a depth of each one of the first and second trench structures is larger than a depth of each one of the third and fourth trench structures.

10. The semiconductor device of claim 1, wherein a width of each one of the first and second trench structures is larger than a width of each one of the third and fourth trench structures.

11. The semiconductor device of claim 1, further comprising a shielding region of the first conductivity type arranged within the drift region and adjoining a bottom side of each one of the third and fourth trench structures.

12. The semiconductor device of claim 1, wherein a first distance between a bottom side of the first body region to a top side of the first body region at a surface of a semiconductor body of the first and second semiconductor elements is smaller than a second distance between a bottom side of the second body region to a top side of the second body region at the surface of the semiconductor body.

13. The semiconductor device of claim 1, wherein
a trench field effect transistor cell array includes a first plurality of the field effect transistor cells;
a second plurality of the sense cells is spread over an area of the trench field effect transistor cell array; and
the first plurality is larger than the second plurality.

14. The semiconductor device of claim 1, wherein
each one of the first and second trench structures includes a gate electrode and at least one field electrode arranged below the gate electrode, the semiconductor device further comprising:
an electric insulator between the gate electrode and the at least one field electrode.

15. The semiconductor device of claim 1, wherein
the first semiconductor element is a superjunction array cell and the first pn junction includes a first p-type pillar region and a first n-type pillar region;
the second semiconductor element is a superjunction sense cell and the second pn junction includes a second p-type pillar region and a second n-type pillar region; and wherein
the first and the second semiconductor elements differ in at least one of a lateral dimension of their p-type pillar region and their n-type pillar region.

16. The semiconductor device of claim 1, wherein
the first semiconductor element is a transistor cell and the first pn junction includes a first body region of a first conductivity type and a first drift region of a second conductivity type different from the first conductivity type;
the second semiconductor element is a sense cell and the second pn junction includes a second body region of the first conductivity type and a second drift region of the second conductivity type; and wherein
a first distance between a bottom side of the first body region to a top side of the first body region at a surface of a semiconductor body of the first and second semiconductor elements is smaller than a second distance between a bottom side of the second body region to a top side of the second body region at the surface of the semiconductor body.

17. The semiconductor device of claim 1, wherein
the first semiconductor element is a transistor cell and the first pn junction includes a first body region of a first conductivity type and a first drift region of a second conductivity type different from the first conductivity type;
the second semiconductor element is a sense cell and the second pn junction includes a second body region of the first conductivity type and a second drift region of the second conductivity type; and wherein
a width of the first body region differs from a width of the second body region.

18. A semiconductor device, comprising:
a first semiconductor element including a first pn junction between a first terminal and a second terminal;
a second semiconductor element including a second pn junction between a third terminal and a fourth terminal;
a semiconductor body including the first semiconductor element and the second semiconductor element monolithically integrated; and wherein the first and third terminals are electrically coupled to a first device terminal;
the second and fourth terminals are electrically coupled to a second device terminal; and
a temperature coefficient $\alpha_1$ of a breakdown voltage $V_{br1}$ of the first pn junction and a temperature coefficient $\alpha_2$ of a breakdown voltage $V_{br2}$ of the second pn junction have a same algebraic sign and satisfy $0.6 \times \alpha_1 < \alpha_2 < 1.1 \times \alpha_1$ at T=300K, wherein $V_{br2} < V_{br1}$, wherein the first semiconductor element is a first diode and the first pn junction includes a first anode region of a first conductivity type and a first cathode region of a second conductivity type different from the first conductivity type; and the second semiconductor element is a second diode and
   the second pn junction includes a second anode region of
   the first conductivity type and a second cathode region of
   the second conductivity type; and further comprising:
a transistor including a first load terminal, a second load
   terminal and a control terminal; and wherein the first and
   second load terminals of the transistor and the first semi-
   conductor element are connected in parallel; and further
   comprising: at least one intervening element electrically
   coupled between the first load terminal and the control
   terminal, and wherein the intervening element is one or
   a combination of a current limiting element, a rectifying
   element and a switching element.

19. The semiconductor device of claim 18, wherein:
the transistor is an n-type field effect transistor;
the first load terminal is a drain;
the second load terminal is a source;
the control terminal is a gate; and
the second anode region is electrically coupled to the gate.

20. The semiconductor device of claim 18, wherein the first breakdown voltage $V_{br1}$ of the first pn junction and the second breakdown voltage $V_{br2}$ of the second pn junction satisfy $0<(V_{br1}-V_{br2})/V_{br1}<0.2$.

21. The semiconductor device of claim 18, wherein:
the first anode region includes a first p-type impurity and
   the second anode region includes the first p-type impu-
   rity; and
the first cathode region includes a first n-type impurity and
   the second cathode region includes the first n-type impu-
   rity; and wherein
a lateral concentration profile of at least one of the first
   p-type impurity in the first anode region, the first p-type
   impurity in the second anode region, the first n-type
   impurity in the first cathode region, and the first n-type
   impurity in the second cathode region is corrugated and
   includes maxima and minima.

22. The semiconductor device of claim 18, wherein
the second semiconductor diode includes at least one of
a second p-type impurity in the second anode region that is
   absent in the first anode region, or
a second n-type impurity in the second cathode region that
   is absent in the first cathode region.

23. The semiconductor device of claim 18, wherein
the first diode is an electrostatic discharge protection
   device including an anode area of at least 4000 µm$^2$.

24. A semiconductor device, comprising:
a first semiconductor element including a first pn junction
   between a first terminal and a second terminal;
a second semiconductor element including a second pn
   junction between a third terminal and a fourth terminal;
a semiconductor body including the first semiconductor
   element and the second semiconductor element mono-
   lithically integrated; and wherein
the first and third terminals are electrically coupled to a first
   device terminal;
the second and fourth terminals are electrically coupled to
   a second device terminal; and
a temperature coefficient $\alpha_1$ of a breakdown voltage $V_{br1}$ of
   the first pn junction and a temperature coefficient $\alpha_2$ of a
   breakdown voltage $V_{br2}$ of the second pn junction have a
   same algebraic sign and satisfy $0.6 \times \alpha_1 < \alpha_2 < 1.1 \times \alpha_1$ at
   T=300K, wherein $V_{br2} < V_{br1}$, wherein
the first semiconductor element is a trench field effect
   transistor cell and the first pn junction includes a first
   body region of a first conductivity type and a first drift
   region of a second conductivity different from the first
   conductivity type;
the first body region adjoins a first trench structure at a first
   side of the first body region and the first body region
   adjoins a second trench structure at a second side of the
   first body region opposite to the first side;
the second semiconductor element is a sense cell and the
   second pn junction includes a second body region of the
   first conductivity type and a second drift region of the
   second conductivity type; and
the second body region adjoins a third trench structure at a
   first side of the second body region and the second body
   region adjoins a fourth trench structure at a second side
   of the second body region opposite to the first side; and
further comprising at least one intervening element elec-
   trically coupled between a gate of the trench field effect
   transistor cell and a source of the trench field effect
   transistor cell, and wherein the intervening element is
   one or a combination of a gate dielectric protection
   element, a discharge circuit, a gate clamping element, a
   resistor and a disconnection.

25. A semiconductor device, comprising:
a first semiconductor element including a first pn junction
   between a first terminal and a second terminal;
a second semiconductor element including a second pn
   junction between a third terminal and a fourth terminal;
a semiconductor body including the first semiconductor
   element and the second semiconductor element mono-
   lithically integrated; and wherein
the first and third terminals are electrically coupled to a first
   device terminal;
the second and fourth terminals are electrically coupled to
   a second device terminal; and
a temperature coefficient $\alpha_1$ of a breakdown voltage $V_{br1}$ of
   the first pn junction and a temperature coefficient $\alpha_2$ of a
   breakdown voltage $V_{br2}$ of the second pn junction have a
   same algebraic sign and satisfy $0.6 \times \alpha_1 < \alpha_2 < 1.1 \times \alpha_1$ at
   T=300K, wherein $V_{br2} < V_{br1}$; wherein
the first semiconductor element is a first diode and the first
   pn junction includes a first body region of a first conduc-
   tivity type and a first drift region of a second conductiv-
   ity different from the first conductivity type; and
the second semiconductor element is a second diode and
   the second pn junction includes a second anode region of
   the first conductivity type and a second cathode region of
   the second conductivity type; and further comprising:
a transistor including a first load terminal, a second load
   terminal and a control terminal; and wherein
the first and second load terminals of the transistor and the
   first semiconductor element are connected in parallel;
   and further comprising at least one intervening element
   electrically coupled between the control terminal and
   the second load terminal, wherein the intervening ele-
   ment is one or combination of a gate dielectric protec-
   tion element, a discharge circuit, a gate clamping ele-
   ment, a resistor and disconnection.

* * * * *